United States Patent
Burger et al.

(10) Patent No.: US 9,058,879 B2
(45) Date of Patent: Jun. 16, 2015

(54) METHODS AND APPARATUS FOR STORING DATA IN A MULTI-LEVEL CELL FLASH MEMORY DEVICE WITH CROSS-PAGE SECTORS, MULTI-PAGE CODING AND PER-PAGE CODING

(71) Applicant: Agere Systems LLC, Allentown, PA (US)

(72) Inventors: Harley F. Burger, San Jose, CA (US); Erich F. Haratsch, Bethlehem, PA (US); Milos Ivkovic, Allentown, PA (US); Victor Krachkovsky, Allentown, PA (US); Andrei Vityaev, San Jose, CA (US); Clifton Williamson, Saratoga, CA (US); Johnson Yen, Fremont, CA (US)

(73) Assignee: Seagate Technology LLC, Longmont, CO (US)

( * ) Notice: Subject to any disclaimer, the term of this patent is extended or adjusted under 35 U.S.C. 154(b) by 67 days.

(21) Appl. No.: 14/077,489

(22) Filed: Nov. 12, 2013

(65) Prior Publication Data
US 2014/0126288 A1 May 8, 2014

Related U.S. Application Data

(62) Division of application No. 12/920,407, filed as application No. PCT/US2009/036810 on Mar. 11, 2009, now Pat. No. 8,724,381.

(60) Provisional application No. 61/068,934, filed on Mar. 11, 2008.

(51) Int. Cl.
*G11C 11/34* (2006.01)
*G11C 16/08* (2006.01)
(Continued)

(52) U.S. Cl.
CPC ............ *G11C 16/08* (2013.01); *G06F 11/1072* (2013.01); *G11C 11/5628* (2013.01); *G11C 11/5642* (2013.01); *G11C 16/10* (2013.01); *G11C 16/06* (2013.01)

(58) Field of Classification Search
CPC .................. G11C 11/5628; G11C 2211/5641; G11C 8/10
USPC .............. 365/185.03, 185.33, 185.11, 230.03
See application file for complete search history.

(56) References Cited

U.S. PATENT DOCUMENTS

| | | | |
|---|---|---|---|
| 6,134,141 A | 10/2000 | Wong | |
| 7,257,026 B2 | 8/2007 | Yamada et al. | 365/185.03 |

(Continued)

FOREIGN PATENT DOCUMENTS

| | | |
|---|---|---|
| CN | 1499533 A | 5/2004 |
| CN | 101124556 A | 2/2008 |

(Continued)

*Primary Examiner* — Tuan T Nguyen
(74) *Attorney, Agent, or Firm* — Duft Bornsen & Fettig LLP

(57) ABSTRACT

Methods and apparatus are provided for storing data in a multi-level cell flash memory device with cross-page sectors, multi-page coding and per-page coding. A single sector can be stored across a plurality of pages in the flash memory device. Per-page control is provided of the number of sectors in each page, as well as the code and/or code rate used for encoding and decoding a given page, and the decoder or decoding algorithm used for decoding a given page. Multi-page and wordline level access schemes are also provided.

22 Claims, 11 Drawing Sheets

(51) Int. Cl.
  *G06F 11/10* (2006.01)
  *G11C 16/10* (2006.01)
  *G11C 16/06* (2006.01)
  *G11C 11/56* (2006.01)

(56) References Cited

U.S. PATENT DOCUMENTS

| | | |
|---|---|---|
| 7,388,781 B2 | 6/2008 | Litsyn et al. |
| 7,460,398 B1 * | 12/2008 | Roohparvar et al. .... 365/185.03 |
| 7,917,832 B2 | 3/2011 | Hsieh et al. .................... 714/765 |
| 8,179,719 B1 * | 5/2012 | Yang ........................ 365/185.03 |
| 8,627,188 B2 * | 1/2014 | Weingarten et al. ..... 365/185.09 |
| 8,793,556 B1 * | 7/2014 | Northcott et al. ........ 365/185.29 |
| 2007/0089034 A1 | 4/2007 | Litsyn et al. |
| 2007/0208905 A1 | 9/2007 | Litsyn et al. |
| 2007/0300130 A1 | 12/2007 | Gorobets |
| 2008/0291724 A1 | 11/2008 | Litsyn et al. |
| 2009/0043951 A1 | 2/2009 | Shalvi et al. |
| 2013/0272067 A1 * | 10/2013 | Lee et al. .................. 365/185.11 |
| 2014/0301142 A1 * | 10/2014 | Stoev et al. .............. 365/185.09 |

FOREIGN PATENT DOCUMENTS

| | | |
|---|---|---|
| JP | H11283398 | 10/1999 |
| JP | 2000149592 | 5/2000 |
| JP | 2005078721 | 3/2005 |
| WO | WO 02/49039 | 6/2002 |
| WO | WO 2004/023489 | 3/2004 |
| WO | WO 2006/013529 | 2/2006 |
| WO | WO 2006/065655 | 6/2006 |
| WO | WO 2007/043042 | 4/2007 |

* cited by examiner

METHODS AND APPARATUS FOR STORING DATA IN A MULTI-LEVEL CELL FLASH MEMORY DEVICE WITH CROSS-PAGE SECTORS, MULTI-PAGE CODING AND PER-PAGE CODING

CROSS-REFERENCE TO RELATED APPLICATIONS

This application is a divisional of U.S. patent application Ser. No. 12/920,407, filed Jan. 4, 2011, which claims the benefit of PCT Application No. PCT/US09/36810, filed Mar. 11, 2009, which claims priority to U.S. Provisional Application Ser. No. 61/068,934, filed Mar. 11, 2008, each incorporated by reference herein.

FIELD OF THE INVENTION

The present invention relates generally to multi-level cell flash memory devices and more particularly, to techniques for coding and accessing such multi-level cell devices.

BACKGROUND OF THE INVENTION

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

Single-level cell (SLC) flash memory devices, for example, store one bit per memory cell (or two possible memory states). Multi-level cell (MLC) flash memory devices, on the other hand, store two or more bits per memory cell (i.e., each cell has four or more programmable states). In a multi-level cell flash memory device, the amount of current or voltage is detected, rather than just the presence or absence of a current or voltage. In a multi-level cell device, at least three threshold levels are employed to define four or more different threshold states. The operating range of an individual cell is thus divided into an increased number of states and the range of each state is smaller than for a single-level cell device. Thus, the reliability of any single bit in a multi-level cell device is lower than a single-level cell device. For a more detailed discussion of multi-level cell (MLC) flash memory devices, see, for example, K. Takeuchi et al., "A 56-nm CMOS 99-mm$^2$ 8-Gb Multi-Level NAND Flash Memory with 10-MB/s Program Throughput," IEEE Journal of Solid-State Circuits, Vol. 42, No. 1, 219-232 (2007), and K.-T. Park et al., "A Zeroing Cell-to-Cell Interference Page Architecture with Temporary LSB Storing and Parallel MSB Program Scheme for MLC NAND Flash Memories," IEEE Journal of Solid-State Circuits, Vol. 43, No. 4, 919-928 (2008), each incorporated by reference herein.

Existing flash devices employ page level access techniques, whereby a page is the minimum unit that can be written to or read from the flash memory device. Pages are generally written and read independently from each other. In addition, existing flash memories typically use the same code and code rate to encode (and decode) all pages. Operating systems typically employ data sectors comprised of, for example, 512 bytes of user information. In general, the user data length is a multiple of the sector size. With one typical flash memory configuration, one page comprises eight sectors of user information. Thus, with page level access techniques, the flash controller combines eight sectors of information to write each page to the flash memory device. Each time a sector is read from the flash memory device, a full page is read that contains the desired sector.

A need exists for improved multi-level coding and read/write access techniques for multi-level cell (MLC) flash memory devices to achieve, for example, lower error rates or to improve the storage capacity. A further need exists for improved read/write access techniques for multi-level cell flash memory devices that allows a single sector to be stored across a plurality of pages in the flash memory device. Yet another need exists for improved read/write access techniques that provide per-page control of the number of sectors in each page, as well as the code and/or code rate used for encoding and decoding. For a more detailed discussion of multi-level codes, see, for example, U. Wachsmann et al., "Multilevel Codes: Theoretical Concepts and Practical Design Rules," IEEE Trans. on Information Theory, Vol. 45, No. 5, 1361-91 (1999), incorporated by reference herein.

SUMMARY OF THE INVENTION

Generally, methods and apparatus are provided for storing data in a multi-level cell flash memory device with cross-page sectors, multi-page coding and per-page coding. According to various aspects of the invention, data is stored in multi-level cell flash memory devices having a plurality of cells, wherein each cell of the multi-level cell flash memory device is capable of storing a plurality of bits, wherein each of the plurality of bits is from a different page. One disclosed data storage method comprises the steps of accumulating a plurality of the pages; encoding the plurality of pages as a single block; and storing the single block in the multi-level cell flash memory device. In addition, the stored single block can be decoded to provide the plurality of the pages.

A further storage method comprises the steps of determining a page type of a current page to be written in the multi-level cell flash memory device; determining at least one of a code and a code rate associated with the determined page type; encoding the current page using the determined at least one code and code rate; and storing the encoded current page in the multi-level cell flash memory device. A page can be read in the multi-level cell flash memory device and decoded using the at least one code, code rate, decoder or decoding algorithm associated with the identified page.

Yet another storage method comprises the steps of determining a page type of a current page to be written in the multi-level cell flash memory device; determining a number-of-sectors per page associated with the determined page type; accumulating the determined number-of-sectors; encoding the accumulated sectors; and storing the accumulated sectors in the multi-level cell flash memory device. Upon receiving a request to read at least one sector, one or more pages in the multi-level cell flash memory device having the requested sector can be identified; and the identified one or more pages can be read using one or more of a page type, a multi-page and a wordline level access scheme. The read identified one or more pages can be decoded using at least one of a code, code rate, decoder and decoding algorithm associated with the identified one or more pages and obtaining the requested sector from the decoded one or more pages using a memory map.

Another storage method comprises the steps of storing a first set of logical pages, wherein an encoded size of each logical page in the first set of logical pages is less than a size of the plurality of physical pages; and storing a second set of logical pages, wherein an encoded size of each logical page in the second set of logical pages is greater than a size of the plurality of physical pages and wherein at least a portion of the second set of logical pages is stored in a spillover region of the plurality of physical pages.

According to another aspect of the invention, a multi-level cell flash memory device is disclosed, comprising a plurality of cells, wherein each cell of the multi-level cell flash memory device is capable of storing a plurality of bits, wherein each of the plurality of bits is from a different page; and a plurality of wordlines each comprising a plurality of the pages, wherein each of the plurality of pages is capable of having an associated code rate such that an uncoded length of each of the plurality of pages are substantially similar and a coded length of each of the plurality of pages are different.

Another aspect of the invention provides a multi-level cell flash memory device, comprising: a plurality of cells, wherein each cell of the multi-level cell flash memory device is capable of storing a plurality of bits, wherein each of the plurality of bits is from a different page; and a plurality of wordlines each comprising a plurality of the pages, wherein each of the plurality of pages is capable of having an associated code rate such that an uncoded length of each of the plurality of pages are different and a coded length of each of the plurality of pages are substantially similar.

Yet another aspect of the invention provides a multi-level cell flash memory device, comprising: a plurality of cells, wherein each cell of the multi-level cell flash memory device is capable of storing a plurality of bits, wherein each of the plurality of bits is from a different page; and a plurality of wordlines each comprising a plurality of the pages, wherein at least one sector is capable of spanning the plurality of pages.

A more complete understanding of the present invention, as well as further features and advantages of the present invention, will be obtained by reference to the following detailed description and drawings.

DETAILED DESCRIPTION

Figure 1:
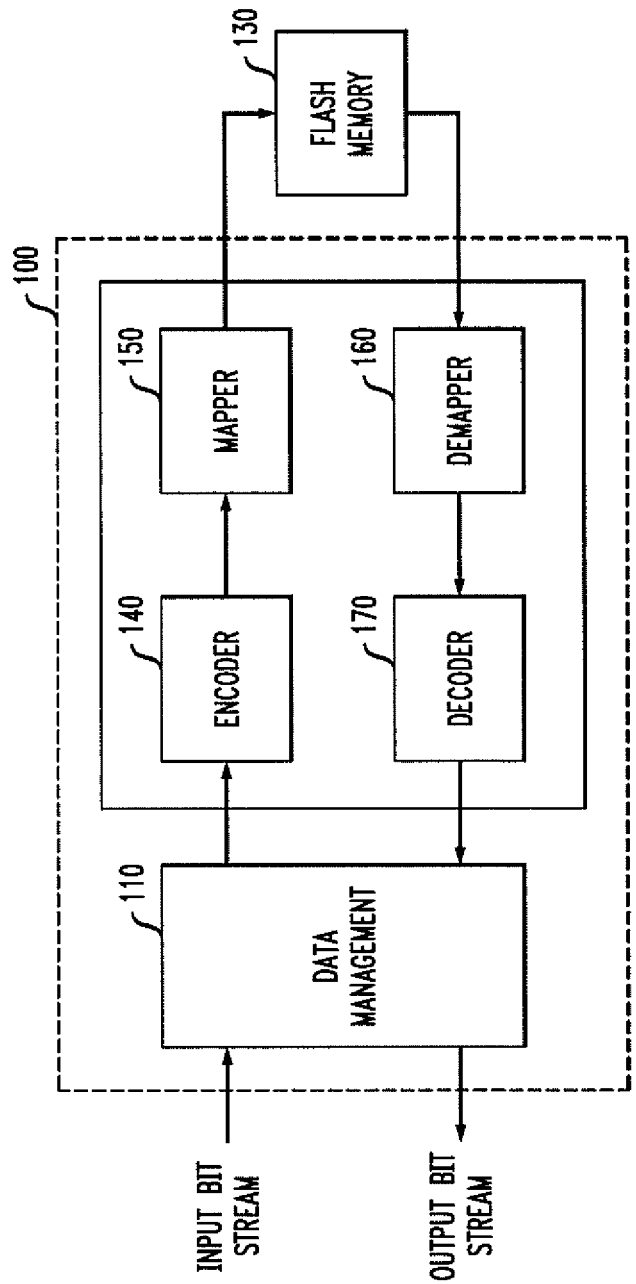
FIG. 1 is a schematic block diagram illustrating the interaction between a flash memory controller in accordance with the present invention and a flash memory device.

The present invention provides multi-level coding and read/write access techniques for multi-level cell (MLC) flash memory devices. As used herein, a multi-level cell flash memory comprises a memory where each memory cell stores two or more bits. Typically, the multiple bits stored in one flash cell belong to different pages. FIG. 1 is a schematic block diagram illustrating the interaction between a flash memory controller 100 in accordance with the present invention and a flash memory device 120. As shown in FIG. 1, user data can be written into and read from a flash memory 130 in accordance with aspects of the present invention, discussed hereinafter. As shown in FIG. 1, an input bit stream is processed by a data management block 110 that performs data accumulation, aggregation, accumulation, collection, partitioning or potentially other tasks such as interleaving. The aggregated or partitioned data is then encoded by an encoder 140, for example, to add redundant bits. In all embodiments of the invention, both systematic and unsystematic codes can be used.

The encoded data is then processed by a mapper 150 that maps the encoded bit stream or streams to programmed voltage levels for programming the flash memory 130. Data is read from the flash memory 130 and processed by a demapper 160 that demaps the read voltage levels to one or more bit streams that are decoded by decoder 170. Generally, the encoder 140 and mapper 150 translate the stream of user data into a stream of states or voltage levels that should be programmed into the cells of the flash memory 130. Likewise, the demapper 160 and decoder 170 translate a stream of cell states or voltage levels read from the flash memory 130 into the stream of user data that was stored in the flash memory 130. The data management block 110 can apply additional data aggregation, accumulation, collection, partitioning, interleaving or other tasks to the encoded data stream at the output of the encoder 140 or at the output of the demapper 160.

Techniques for encoding and decoding the data in accordance with the present invention are discussed further below in conjunction with FIG. 4 and FIG. 13. Suitable techniques for the flash controller 100 are discussed further below in conjunction with, for example, FIGS. 5 and 6. The flash memory 130 may be embodied as a multi-level cell flash memory, such as a multi-level NAND flash or multi-level phase-change memory. Generally, as discussed further below in conjunction with FIGS. 2 and 3, the flash memory 130 includes at least one flash cell array, as well as read and write circuitry.

Multi-Level Cell Flash Memory

Figure 2:
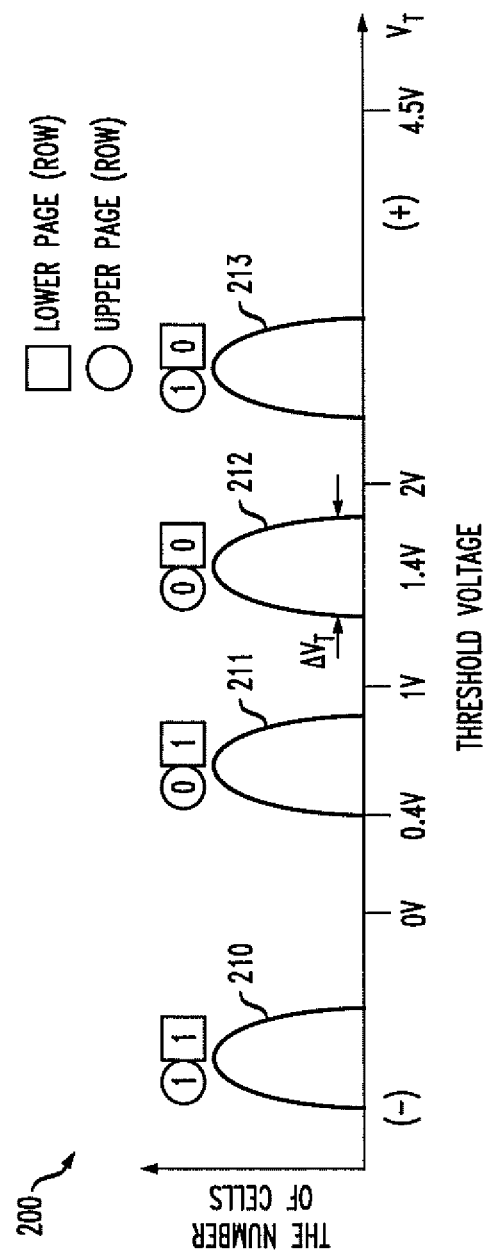
FIG. 2 illustrates an exemplary threshold voltage distribution for the exemplary multi-level cell flash memory of FIG. 1.

In a multi-level cell flash memory, a threshold detector is typically employed to translate the voltage value associated with a particular cell to a predefined memory state. FIG. 2 illustrates an exemplary threshold voltage distribution for the exemplary multi-level cell flash memory 130 of FIG. 1, based on the teachings of U.S. Pat. No. 6,522,580, incorporated by reference herein. In the exemplary embodiment shown in FIG. 2, each storage element employs four possible data states to store two bits of data in each memory cell. FIG. 2 illustrates four peaks 210-213, with each peak corresponding to one state. In a multi-level cell flash device, the different peaks 210-213 of the threshold voltage distribution graph 200 are used for storing two bits in the cell.

The peaks 210-213 of the threshold voltage distribution graph 200 are labeled with binary values 11, 01, 00 and 10, respectively. Thus, when a cell is in a first state 210, it represents a "1" for the lower bit and a "1" for the upper bit (this is generally the initial unprogrammed or erased state of the cell). Likewise, when a cell is in the second state 211, it represents a "1" for the lower bit and a "0" for the upper bit. When a cell is in the third state 212, it represents a "0" for the lower bit and a "0" for the upper bit. Finally, when a cell is in the fourth state 213, it represents a "0" for the lower bit and a "1" for the upper bit.

Threshold voltage distribution 210 represents a distribution of the threshold levels $V_T$ of the cells within the array that are in an erased state ("11" data state), with negative threshold voltage levels below 0 volts. Threshold voltage distributions 211 and 212 of memory cells storing "01" and "00" user data, respectively, are shown to be between 0 and 1 volts and between 1 and 2 volts, respectively. Threshold voltage distribution 213 shows the distribution of cells that have been programmed to the "10" data state, with a threshold voltage level set between 2 and 4.5 volts of the read pass voltage.

As discussed further below, each of the two bits stored in a single memory cell is from a different page. In other words, each bit of the two bits stored in each memory cell carries a different page address. The right side bit shown in FIG. 2 is accessed when a lower page address is input. The left side bit is accessed when an upper page address is input.

Figure 3:
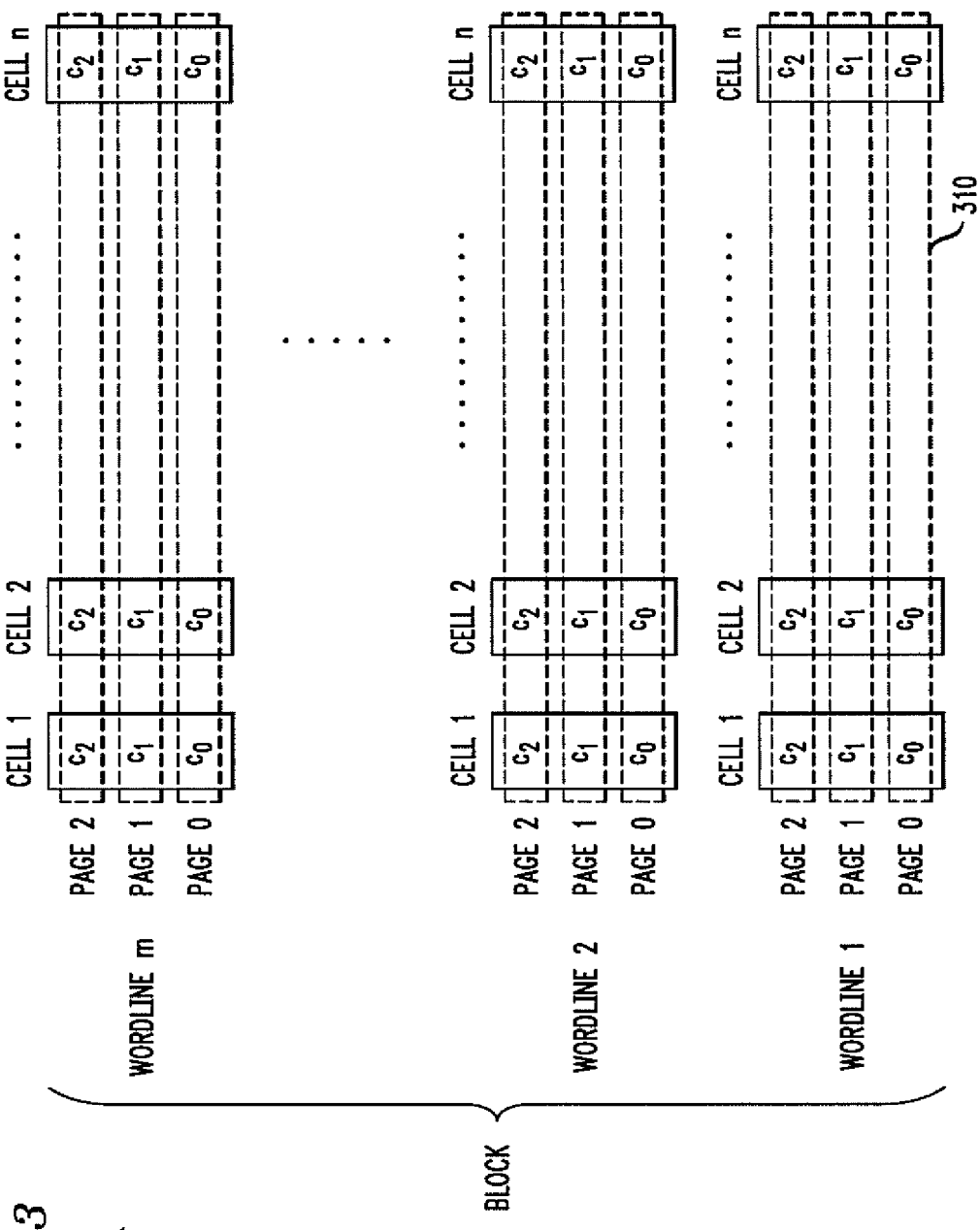
FIG. 3 illustrates a flash cell array in a multi-level cell (MLC) flash memory device.

A flash memory is typically organized in blocks, where each block is implemented as a flash cell array. FIG. 3 illustrates a flash cell array 300 in a multi-level cell (MLC) flash memory device 130. As shown in FIG. 3, the flash cell array 300 stores two or more bits per flash cell, $c_i$. FIG. 3 illustrates the flash cell array architecture for one block, where each exemplary cell typically corresponds to a floating-gate transistor that stores three bits. The exemplary cell array 300 consists of m wordlines and n bitlines. Generally, in multi-page cell flash memories, each page is a multiple of the sector size, and the bits within a single cell belong to different pages. In the example of FIG. 3, the three bits for each cell correspond to three different pages, and each wordline stores three pages. In the following discussion, pages 0, 1, and 2 are referred to as the lower, middle, and upper page levels. In addition, each page in the flash cell array 300, such as page 310, typically comprises a fixed number of sectors, such as 8 sectors. According to one aspect of the invention, each page can be a non-integer multiple of the sector size.

A flash cell array can be further partitioned into even and odd pages, where for example cells with even numbers (such as cells 2 and 4 in FIG. 3) correspond to even pages, and cells with odd numbers (such as cells 1 and 3 in FIG. 3) correspond to odd pages. In this case, a page (such as page 0) would contain an even page (even page 0) and an odd page (odd page 0). For a further discussion of even and odd pages, see for example K.-T. Park et al., "A Zeroing Cell-to-Cell Interference Page Architecture with Temporary LSB Storing and Parallel MSB Program Scheme for MLC NAND Flash Memories," IEEE Journal of Solid-State Circuits, Vol. 43, No. 4, 919-928 (2008), incorporated by reference herein. All aspects of the invention can be applied to flash cell arrays with even/odd page partitioning, or other flash cell array partitionings. In the following, page refers either to a page as shown in FIG. 3, or an even page, or an odd page.

Joint Encoding or Per-Page Encoding

According to one aspect of the invention, each page in a wordline can optionally be encoded with different code rates or different types of codes (or both). For example, Low Density Parity Check Codes (LDPC), Bose-Chaudhuri-Hocquenghem (BCH) and Reed Solomon (RS) codes may be employed. In one embodiment, more powerful codes or lower code rates can be employed for the pages that need improved reliability. For example, higher page numbers may have a higher likelihood of error. Thus, these pages may be encoded with a code or code rate (or both) that improve the performance of these pages. More powerful error correcting codes (such as lower rate codes and LDPC codes) can be used for the higher pages associated with a higher error rate, and less powerful error correcting codes (such as higher rate codes and algebraic codes) can be used for the lower pages associated with a lower error rate.

Thus, the present invention allows the encoding parameters of each page within a wordline of the multi-level flash cell array 300 to be uniquely established. For example, one embodiment of the present invention allows per-page control of the (i) number of sectors per page, (ii) code, (iii) code rate used to partition and/or encode the page and/or (iv) decoder or decoder algorithm used to decode the page.

As discussed further below in conjunction with FIG. 4, the j pages of data in each wordline (where j is the number of pages per wordline in the flash cell array 300) can optionally be encoded by the encoder 140 using an independent encoding scheme with up to j unique codes and/or code rates. For example, in the embodiment shown in FIG. 4, each page can optionally employ a unique code and code rate. Page can for example refer to the three pages in a wordline as shown in FIG. 3, or to six pages (three even and three odd pages) in a 3 bit/cell flash cell array with even and odd pages.

Another aspect of the invention, discussed below in conjunction with FIGS. 1 and 5, supports a joint encoding scheme, whereby the j pages of data in each wordline can be encoded by the encoder 140 with a single code and code rate.

Page, Multi-Page and Wordline Level Access Schemes

According to another aspect of the invention, the multi-page cell flash memory 130 may be accessed on a page-level, multi-page-level or wordline-level basis. As previously indicated, existing flash devices employ page level access techniques, whereby a page is the minimum unit that can be written to or read from the flash memory device. In addition, the present invention allows (i) multi-page level access techniques, whereby multiple pages can be employed as the minimum unit for coding, writing to or reading from the flash memory device; and (ii) wordline-level access techniques, where a wordline is the minimum data unit for coding, reading or writing data. In this manner, the present invention provides greater flexibility and efficiency by allowing codewords to be encoded across page boundaries, or by allowing variable code rates for different pages in a wordline. In addition, the present invention allows improved encoding and decoding schemes to be employed, such as LPDC encoding techniques that encode multiple pages together.

As discussed further below, the data management block 110 accumulates data from the input bit stream based on whether a page level, multi-page or wordline level access scheme is being employed. While in multi-page or wordline level access schemes data management and encoding may be performed for multiple pages or a whole wordline, these multiple pages or wordlines may be written physically by writing pages sequentially to the flash memory using known techniques.

Encoding/Decoding of Pages in Wordline

Figure 4:
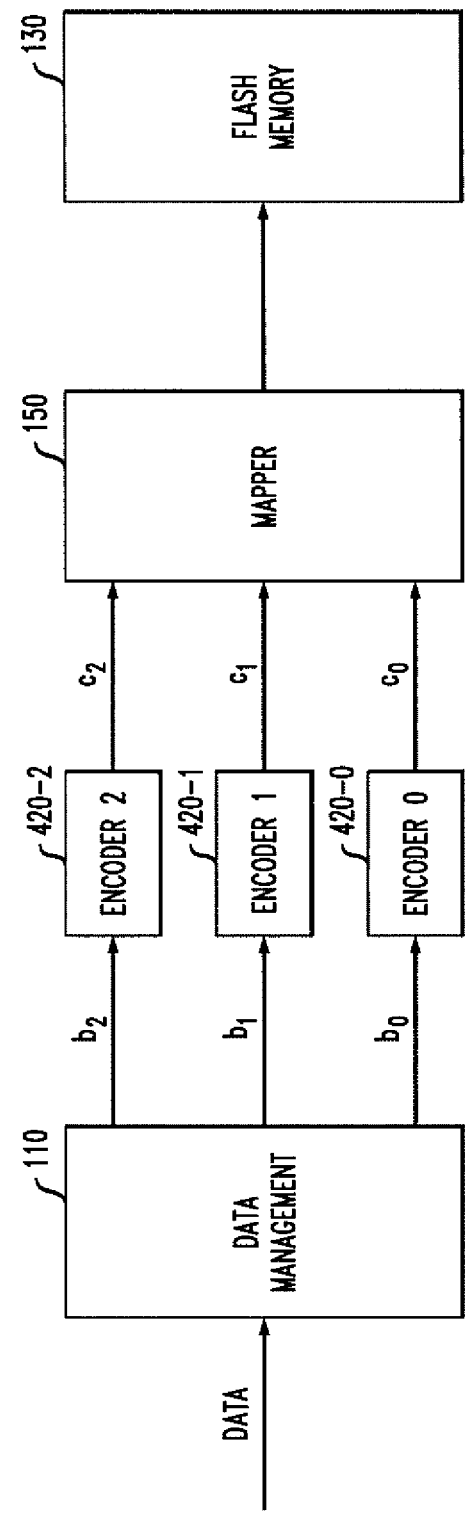
FIG. 4 illustrates an exemplary encoder for the flash cell array of FIG. 3 according to one aspect of the present invention.

FIG. 4 illustrates an exemplary encoder 400 for the multi-page cell flash array 300 of FIG. 3 according to one aspect of the present invention. As previously indicated, each page in the exemplary flash memory 130 can be encoded independently. As shown in FIG. 4, three distinct encoders 420-1 through 420-3 are used for the three exemplary pages in an exemplary wordline. The three encoders 420-1 through 420-3 can differ in terms of type of coding (for example, LDPC, BCH and RS), or code rate or both. As indicated above, a lower page level can be encoded at a higher code rate than the middle and upper page levels (or vice versa). In one variation, some page levels with sufficient reliability may not be encoded at all. As shown in FIG. 4, after data partitioning in the data management unit 110, discussed further below, each bit within one cell is encoded by a separate encoder 420-1 through 420-3 before being stored in the appropriate cell of the flash cell array 300.

According to another aspect of the invention, each page in a wordline can be decoded with a different type of decoder, such as LDPC, BCH, RS, hard-decision or soft-decision decoders. For example, pages within a wordline that are associated with a lower error rate can be decoded using a hard-decision decoder, while pages associated with a higher error rate can be decoded using a soft-decision decoder. Hard-decision decoders would typically use the encoded bits read from the flash cell array 300. Soft-decision decoders would use soft information, for example voltage values that are read from the cells in the flash cell array 300.

In a further variation, when the decoders implement iterative decoding, the decoders for each page can implement a different numbers of iterations. For example, pages within a wordline that are associated with a higher error rate can be decoded using a greater number of iterations, while pages associated with a lower error rate can be decoded using a fewer number of iterations than higher error rate pages. In addition, as discussed further below in conjunction with FIG. 13, another aspect of the present invention decodes multiple pages within a wordline, where, for example, the decoder for one page feeds a decision to the decoder of another page to improve the overall error rate. For a discussion of hard- and soft-decision decoders, iterative decoding, LDPC coding, and other coding techniques, see, for example, S. Lin and D. Costello, "Error Control Coding: Fundamentals and Applications, Second Edition" Pearson Prentice Hall (2004), incorporate by reference herein.

Figure 5:
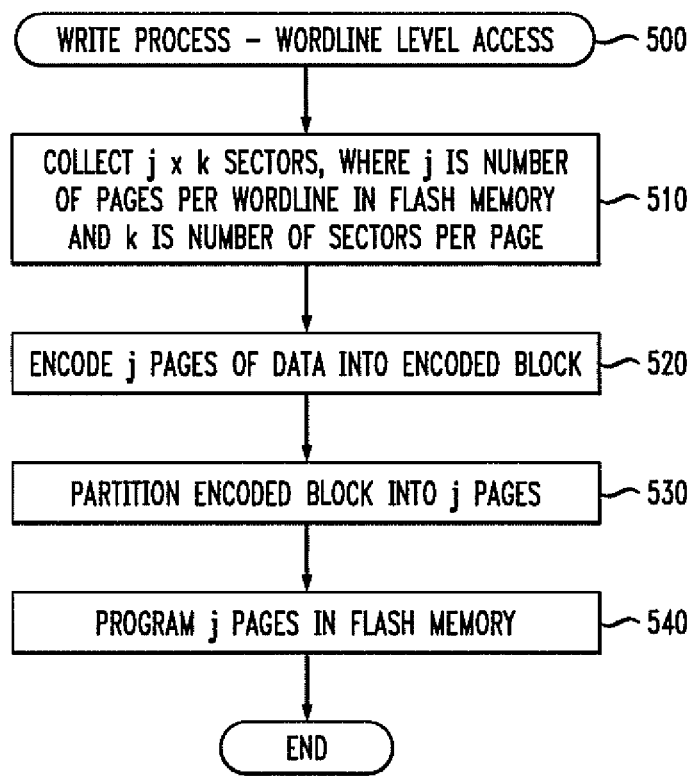
FIG. 5 is a flow chart describing an exemplary implementation of a write process for a wordline level access scheme incorporating features of the present invention.

FIG. 5 is a flow chart describing an exemplary implementation of a write process 500 for a wordline level access scheme incorporating features of the present invention. As shown in FIG. 5, the exemplary wordline level write process 500 initially collects j by k sectors during step 510, where j is the number of pages per wordline in the flash cell array 300 and k is the number of sectors per page. It is noted that during step 510 one or more pages may require buffering, for example, using memory circuits in the data management block 110, until three full pages of data are available (for the exemplary 3-bit-per-cell embodiment of FIG. 3). Thereafter, the wordline level write process 500 encodes j pages of data into an encoded block during step 520. The encoded block is optionally partitioned into j pages during step 530. The j pages are then programmed in the flash cell array 300 during step 540.

It is noted that in various embodiments of the present invention, the j pages of data can be jointly encoded with a single code and code rate by using the encoder 140 as shown in FIG. 1, or independently encoded using up to j codes and code rates (with a unique code and code rate for each page) by using the encoder 420 as shown in FIG. 4. It is further noted that in a joint encoding scheme, the partitioning during step 530 is typically performed after the encoding of step 520, as shown in FIG. 5, while for an independent encoding scheme, the data is generally partitioned into pages prior to the encoding of step 520.

Figure 6:
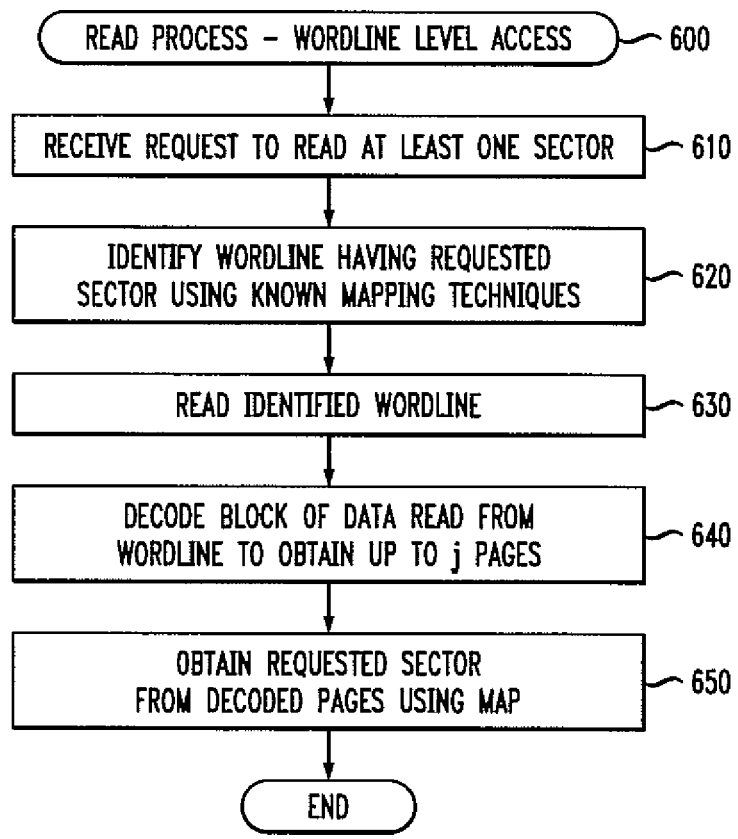
FIG. 6 is a flow chart describing an exemplary implementation of a read process for a wordline level access scheme incorporating features of the present invention.

FIG. 6 is a flow chart describing an exemplary implementation of a read process 600 for a wordline level access scheme incorporating features of the present invention. As shown in FIG. 6, the exemplary wordline level read process 600 initially receives a request during step 610 to read at least one sector. Thereafter, the wordline level read process 600 identifies the wordline having the requested sector during step 620 using known mapping techniques. The wordline level read process 600 reads the identified wordline during step 630, for example, by reading successively all pages stored in the wordline, and decodes the block of data read from the wordline during step 640 to obtain up to j pages. In a further alternative embodiment of the invention, soft information is read from the wordline for wordline level reading, such as the voltage values for the cells in the wordline, during step 630, based on which up to j pages can be decoded during step 640. With sufficient soft information, all pages within a wordline can be decoded. It is noted that in various embodiments of the present invention, the block of data read from the wordline can be decoded with a single code and code rate, or up to j codes and code rates (with a unique code and code rate for each page), based on how the data was written to the flash memory during step 520. Finally, the wordline level read process 600 obtains the requested sector during step 650 from the decoded pages using the memory map created during the write process 500.

Variable Code Rate Multi-Level Cell

Figure 7:
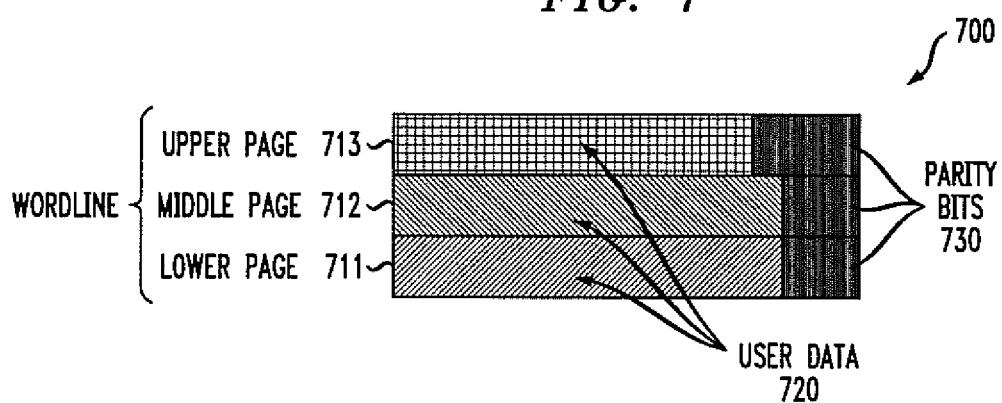
FIG. 7 illustrates a variable code rate encoding scheme incorporating features of the present invention where each page within a wordline is encoded to the same length with a different code rate.

As previously indicated, one aspect of the present invention allows each page within a wordline to be independently encoded and decoded with different codes and/or code rates for each page. In one variation, each page within a wordline can be encoded with a different code rate. FIG. 7 illustrates a variable code rate encoding scheme 700 incorporating features of the present invention where each page within a wordline is encoded to the same length with a different code rate. As shown in the exemplary implementation of FIG. 7, the lower and middle pages 711, 712 are encoded using the same code rate and comprise the same amount of user data 720 and parity bits 730. The upper page 713 is encoded with a lower code rate, relative to pages 711, 712, and thus encodes less user data 720 and has a greater number of parity bits 730 available. For example, the encoded lower and middle pages 711, 712 may comprise 7 sectors, while the encoded upper page 713 may comprise 6 sectors. Suitable write and read processes to support the variable code rate encoding scheme 700 of FIG. 7 are discussed further below in conjunction with FIGS. 8 through 11.

Thus, the present invention allows code rates to be chosen such that the pages in a wordline have the same encoded length, but different uncoded lengths. As discussed hereinafter, the controller 100 can partition the received data stream based on the user data size of a page and based on the page type(s) (i.e., code rate and number of sectors per page) in the flash memory that are available for programming. The page location can be chosen to maximize system performance in terms of format efficiency, read, and write speed.

Figure 8:
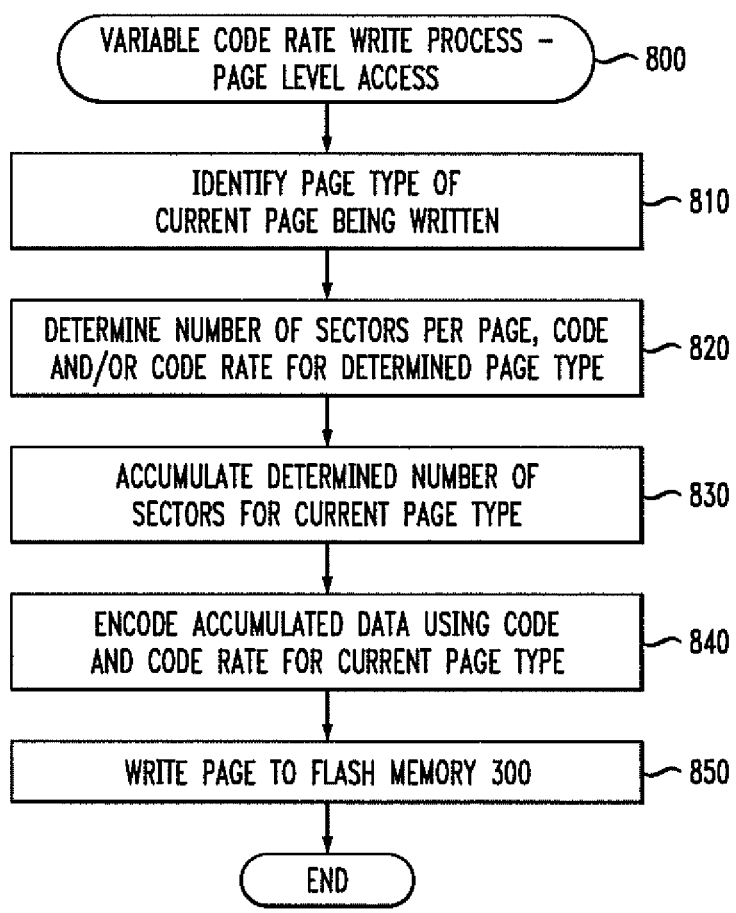
FIG. 8 is a flow chart describing an exemplary implementation of a variable code rate write process for writing the flash memory 130, when each page comprises an integer number of sectors.
Figure 9:
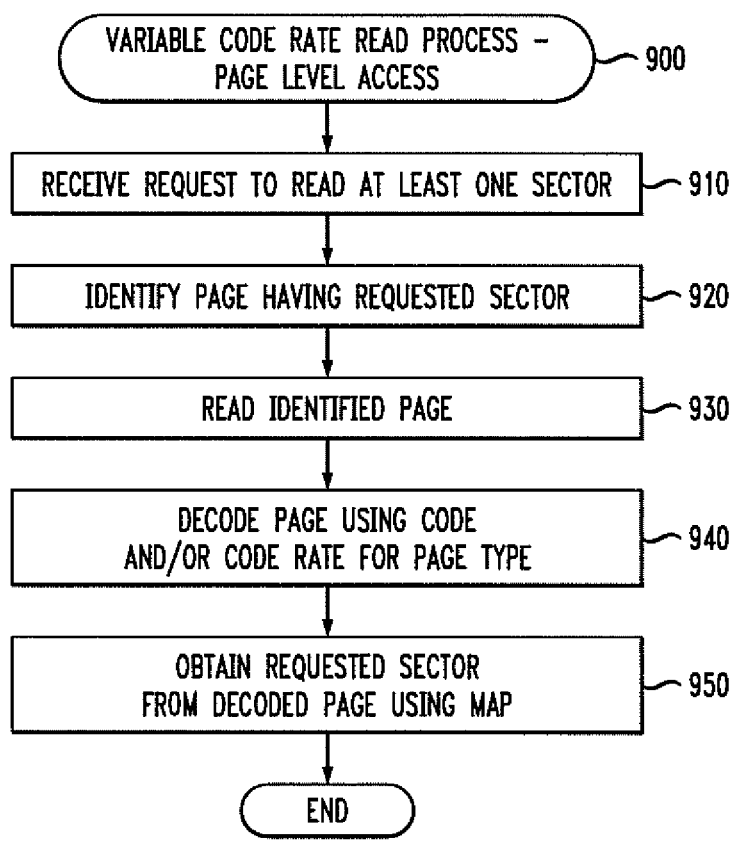
FIG. 9 is a flow chart describing an exemplary implementation of a variable code rate read process for reading the flash memory 130 when each page comprises an integer number of sectors.
Figure 10:
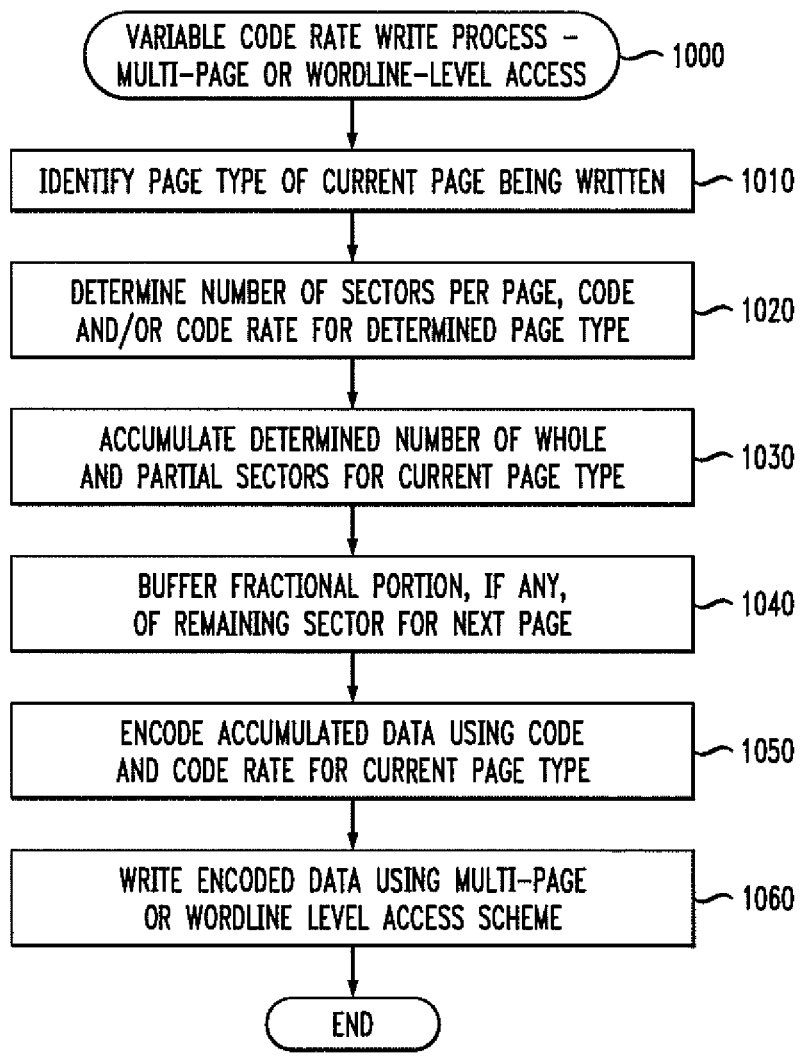
FIG. 10 is a flow chart describing an exemplary implementation of a variable code rate write process for writing the flash memory, when each page comprises a non-integer number of sectors and a given sector can span more than one page.
Figure 11:
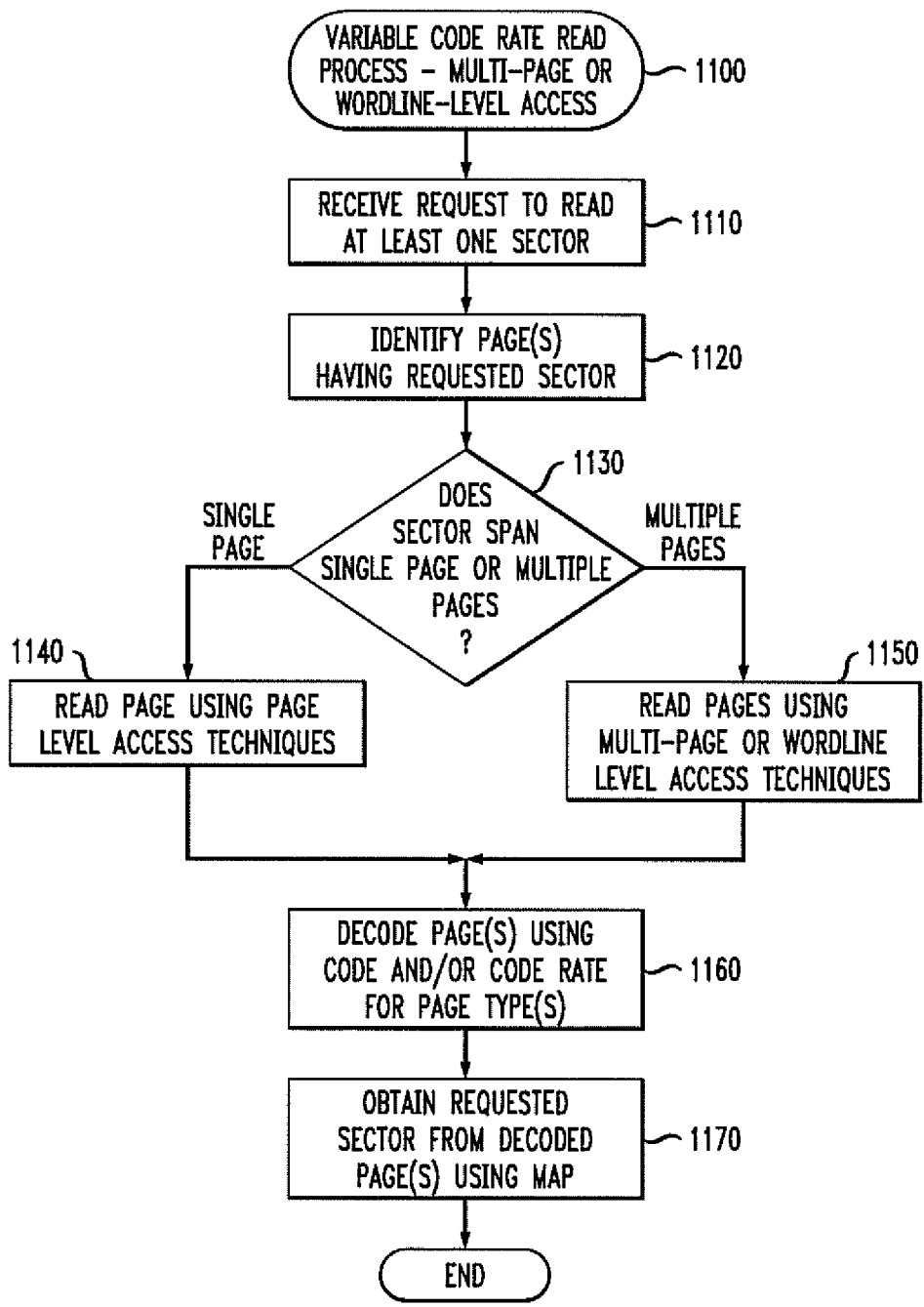
FIG. 11 is a flow chart describing an exemplary implementation of a variable code rate process for reading the flash memory when one or more pages can comprise a non-integer number of sectors and a given sector can span more than one page.

FIGS. 8 and 9 illustrate variable code rate processes for writing and reading, respectively, the flash memory 130 when each page comprises an integer number of sectors. FIGS. 10 and 11 illustrate variable code rate processes for writing and reading, respectively, the flash memory 130 when one or more pages can comprise a non-integer number of sectors and a given sector can span more than one page.

FIG. 8 is a flow chart describing an exemplary implementation of a variable code rate write process 800 for writing the flash memory 130, when each page comprises an integer number of sectors. Generally, the write process 800 employs a page level access scheme and novel techniques for partitioning the user data based on the page type (i.e., page level) that is being encoded. In addition, the write process 800 also employs the appropriate code rate associated with the identified page type. For example, in one exemplary implementation, the lower and middle pages of a wordline can comprise eight sectors of user data, while the upper page can comprise seven sectors of user data. Thus, if the lower or middle pages are being programmed, eight sectors of user data should be accumulated, while if the upper page is being programmed, then seven sectors of user data should be accumulated.

As shown in FIG. 8, the write process 800 initially determines the page type (i.e. page level and/or even or odd page) of the current page being written during step 810 and determines the number of sectors per page and the code and/or code rate for the determined page type during step 820. The write process 800 accumulates the determined number of sectors for the current page type during step 830. The accumulated data is encoded during step 840 using the code and code rate for the current page, and the page is written to the flash cell array 300 during step 850.

FIG. 9 is a flow chart describing an exemplary implementation of a variable code rate read process 900 for reading the flash memory 130 when each page comprises an integer number of sectors. Generally, the read process 900 employs a page level access scheme. As shown in FIG. 9, the exemplary variable code rate page-level read process 900 initially receives a request during step 910 to read at least one sector. Thereafter, the variable code rate page-level read process 900 identifies the page having the requested sector during step 920. The variable code rate page-level read process 900 reads the identified page during step 930 and then the page is decoded during step 940 using the code and/or code rate that are appropriate for the current page type. The requested sector is obtained from the decoded page using the memory map during step 950.

As previously indicated, FIGS. 10 and 11 illustrate variable code rate processes for writing and reading, respectively, the flash memory 130 when one or more pages can comprise a non-integer number of sectors and a given sector can span more than one page.

In an implementation where a sector can span multiple pages (for example, where each page has a non-integer number of sectors), multi-page or wordline level access techniques should be employed to implement the variable code rate scheme. FIG. 10 is a flow chart describing an exemplary implementation of a variable code rate write process 1000 for writing the flash memory 130, when each page comprises a non-integer number of sectors and a given sector can span more than one page. Generally, the write process 1000 employs a multi-page or wordline level access scheme and novel techniques for partitioning the user data based on the page type (i.e., page level such as lower, middle or upper page, or even or odd page) that is being encoded. In addition, the write process 1000 also employs the appropriate code rate associated with the identified page type. As shown in FIG. 10, the write process 1000 initially identifies the page type of the current page being written during step 1010 and determines the number of sectors per page and the code and/or code rate for the determined page type during step 1020. It is again noted that the number of sectors per page may be a non-integer number. The write process 1000 accumulates the determined number of whole and partial sectors for the current page type during step 1030. The write process 1000 then buffers the fractional portion, if any, of the remaining sector during step 1040 for the next page. The buffering may be performed, for example, in memory circuits in the data management block 110. The accumulated data is encoded during step 1050 using the code rate for the current page type and the encoded data is written to the flash cell array 300 during step 1060 using a multi-page or wordline level access scheme, as appropriate. Generally, in a multi-page access scheme, steps 1010 to 1050 are repeated before step 1060 until multiple pages have been encoded. Then, these encoded pages are written to the flash memory, for example, sequentially using known techniques. In a wordline level access scheme, steps 1010 to 1050 are repeated before step 1060 until all pages within a wordline have been encoded. Then, the full wordline is written to the flash memory, for example by sequentially writing all pages within the wordline using known techniques.

FIG. 11 is a flow chart describing an exemplary implementation of a variable code rate process 1100 for reading the flash memory 130 when one or more pages can comprise a non-integer number of sectors and a given sector can span more than one page. Generally, the read process 1100 employs a multi-page or wordline level access scheme. As shown in FIG. 11, the exemplary variable code rate read process 1100 initially receives a request during step 1110 to read at least one sector. The variable code rate read process 1100 then identifies the one or more page(s) during step 1120 having the requested sector.

A test is performed during step 1130 to determine if the sector spans a single page or multiple pages. If it is determined during step 1130 that the sector spans a single page, then the page is read during step 1140 using page level access techniques. If, however, it is determined during step 1130 that the sector spans multiple pages, then the pages are read during step 1150 using multi-page or wordline level access techniques. Generally, in a multi-page access scheme, multiple pages are read and in a wordline level access scheme, a full wordline is read. Multiple pages or a full wordline can be read by reading pages sequentially from the flash memory. In a further alternative embodiment of wordline level reading, soft information is read from the wordline, such as the voltage values for the cells in the wordline, based on which the pages can be decoded. With sufficient soft information, all pages within a wordline can be decoded.

Thereafter, the variable code rate read process 1100 decodes the read page(s) during step 1160 using the code and/or code rate that are appropriate for these page type(s) (i.e. level(s) and or even or odd pages). Finally, the variable code rate read process 1100 obtains the requested sector from the decoded page(s) during step 1170 using the memory map.

Cross-Page Storage in Multi-Level Cell

In another embodiment of the invention, pages can spill across physical page boundaries. In this case, logical pages used for data partitioning and encoding purposes are distinguished from physical pages that are stored in a wordline, as shown in FIG. 3. Logical pages can be encoded using, for example, the encoding scheme shown in FIG. 4. In general, the logical pages in a wordline can have the same uncoded length (i.e., the same amount of user data), but different coded lengths. For example, a variable code rate implementation for logical pages with the same user data length can lead to encoded logical pages of different lengths, in which case some logical pages spill over from one page in a wordline to another page in the wordline. In this manner, the invention proposes to use a portion of the cells (called spill-over cells) in a wordline to store the logical data portion that crosses physical page boundaries. In this case, a spill-over cell unlike a regular cell can store at least two bits that belong to the same logical page. As discussed hereinafter, the spill-over cells can be programmed either at the same time as the other cells in a wordline, or after the other logical pages fitting into a physical page have been programmed. In one exemplary implementation, spill-over cells 1220 can be used to store additional parity bits for upper page 2.

Figure 12:
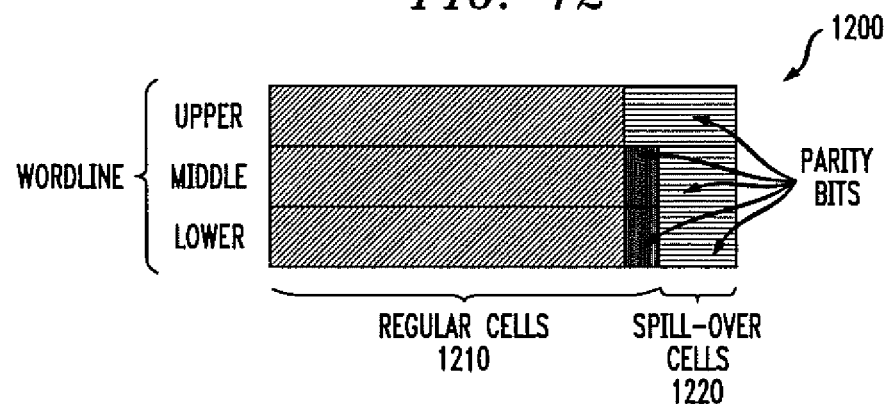
FIG. 12 illustrates a multi-page cell wordline with regular cells and spill-over cells.

FIG. 12 illustrates a multi-page cell wordline 1200 with regular cells 1210 and spill-over cells 1220. In the exemplary embodiment of FIG. 12, lower logical page 0 and middle logical page 1 have the same coded length, and upper logical page 2 spills over into the physical pages 0 and 1. In one implementation, logical pages 0 and 1 can first be programmed into the regular cells 1210 of the wordline 1200 without programming the spill-over cells 1220. Then, logical page 2 is programmed into the upper page of the regular cells 1210, and into all pages of the spill-over cells 1220. For example, the lower, middle and upper pages 0, 1, 2 can be programmed into regular cells 1210, in a similar manner to a conventional flash memory. When the upper page is programmed, the lower, middle and upper bits of the spill-over cells 1220 are programmed as well (for example, immediately after the upper page programming of regular cells is performed).

In another implementation, multi-page or wordline level access techniques are employed to program an entire physical page including the regular and spill-over portion at once, in a similar manner to FIG. 5, discussed above. For example, the data management unit 110 can collect multiple sectors and partition the aggregated data into j logical pages. The j logical pages can then be encoded using up to j encoders. The data management unit 110 then partitions the encoded data into j physical pages, which are then written into the disk, where both the regular and spill-over section of the physical page can be written at once. The j physical pages can be written sequentially to the flash cell array using known techniques. In another embodiment of the invention, the number of logical pages and physical pages can be different: the data management unit can partition the sectors into j logical pages after data collection, and partition the encoded data into j' physical pages after encoding for programming.

Logical pages that do not spill over can be programmed and read independently from each other, for example, using page-level access techniques. When logical pages that spill over are programmed or read, at least two physical pages must be accessed, using multi-page or wordline level access techniques, as discussed above in conjunction with FIGS. 5, 6, 10, 11.

In a further variation, spill-over pages can be read by initially reading only the physical page (i.e., physical page 2 in the example of FIG. 12) without the spill-over cells. If a decoding error occurs as determined for example by a cyclic redundancy check (CRC) code or parity check code, the spill-over cells 1220 can be read as well. Another option in the case of a decoding error is to read out the other physical pages as well (i.e., physical pages 0 and 1 in FIG. 12) to obtain the full logical page with the spill-over cells for decoding. Alternatively, the other physical pages (i.e., physical pages 0 and 1 in FIG. 12) could be read from a buffer to obtain the data stored in the spill-over cells, if these pages have been read out before and stored into a buffer. Another option in the case of a decoding error is to read out the full wordline 1200 to obtain the full logical page with spill-over cells 1220.

Multi-Stage Decoding

Figure 13:
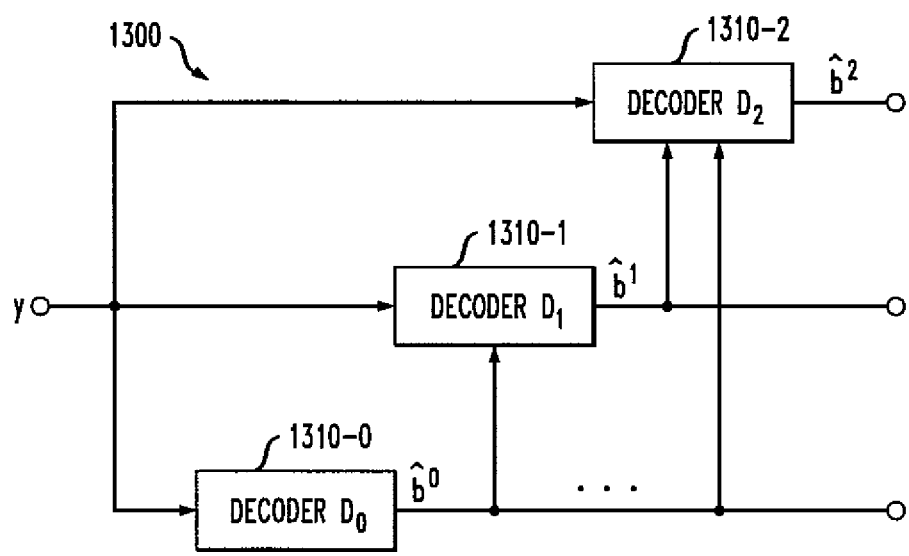
FIG. 13 is a schematic block diagram of a multi-stage decoder incorporating features of the present invention.

FIG. 13 is a schematic block diagram of a multi-stage decoder 1300 incorporating features of the present invention. As shown in FIG. 13, in a multi-stage decoder 1300, component codes are successively decoded by corresponding decoders 1310-0 through 1310-2 For a more detailed discussion of an exemplary multi-stage decoder 1300, see, for example, U. Wachsmann et al., "Multilevel Codes: Theoretical Concepts and Practical Design Rules," IEEE Trans. on Information Theory, Vol. 45, No. 5, 1361-91 (1999), incorporated by reference herein.

In accordance with the present invention, the multi-stage decoder 1300 decodes the multiple pages within a wordline, where, for example, the decoder for one page, such as decoder 1310-0, feeds a decision to the decoder of another page such as decoder 1310-1, to improve the overall error rate. In FIG. 13, y is the output from the demapper, and $\hat{b}^0$, $\hat{b}^1$ and $\hat{b}^2$ are the decoded bits at the output of decoders for page 0, 1, and 2 respectively. In an alternative implementation, the decoder for one page can feed log-likelihood ratios (LLRs) or soft information to the decoder for another page. FIG. 13 shows one exemplary decoding order, where decisions are fed from the lowest page 0 to the highest page 1. Other decoding orders, for example from page 1 to 0 to 2 can be implemented without departing from the spirit of the invention.

In another aspect of the invention, a page can first be decoded without decoding other pages or independently from them. If a decoding error occurs, as indicated for example by a failed parity check, other pages from the wordline can be read to perform multistage decoding as shown in FIG. 13.

It can be shown that multilevel coding with multistage decoding can approach the Shannon capacity if the encoder rates at each bit level are matched to the capacities of the respective bit-level channels. As previously indicated, the present invention allows more powerful codes or lower code rates to be employed for pages that need improved reliability. Thus, if the selected code rate is substantially matched to the capacity of the bit level channel, then the storage capacity can approach the Shannon capacity.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for storing data in a multi-level cell flash memory device having a plurality of cells, wherein each cell of said multi-level cell flash memory device is capable of storing a plurality of bits, wherein each of said plurality of bits is from a different page, said method comprising:
   determining a page type of a current page to be written in said multi-level cell flash memory device;
   determining at least one of a code and a code rate associated with said determined page type;
   encoding said current page using said determined at least one code and code rate; and
   storing said encoded current page in said multi-level cell flash memory device, wherein a first page type having a lower reliability than a second page type is encoded using one or more of a more powerful code and a lower code rate than said second page type.

2. The method of claim 1, further comprising the steps of determining a number-of-sectors per page associated with said determined page type and accumulating said determined number-of-sectors prior to said step of encoding said current page.

3. The method of claim 1, wherein each page in a wordline is encoded to a substantially similar length using a corresponding code rate.

4. The method of claim 1, further comprising the steps of receiving a request to read at least one sector; identifying a page in said multi-level cell flash memory device having said requested sector; reading said identified page and decoding said read page using said at least one code and code rate associated with said identified page and obtaining said requested sector from said decoded page using a memory map.

5. The method of claim 1, further comprising the step of decoding one or more pages using a multi-stage decoder comprising a plurality of decoding stages to decode a plurality of pages in a wordline.

6. The method of claim 5, wherein a decoding stage for a first page provides a decision to a decoding stage for another page.

7. The method of claim 6, wherein said decision is one or more of a hard decision and a soft decision.

8. The method of claim 1, wherein a first page is decoded, and wherein said method further comprises the step of decoding at least one additional page if a decoding error for said first page is detected.

9. The method of claim 1, wherein said multi-level cell flash memory device further comprises:
   a plurality of wordlines each comprising a plurality of said pages, wherein each of said plurality of pages has an associated code rate such that an uncoded length of each of said plurality of pages are substantially similar and a coded length of each of said plurality of pages are different.

10. The method of claim 1, wherein said multi-level cell flash memory device further comprises:
   a plurality of wordlines each comprising a plurality of said pages, wherein each of said plurality of pages has an associated code rate such that an uncoded length of each of said plurality of pages are different and a coded length of each of said plurality of pages are substantially similar.

11. The method of claim 1, wherein said multi-level cell flash memory device further comprises:
   a plurality of cells, wherein each cell of said multi-level cell flash memory device is capable of storing a plurality of bits, wherein each of said plurality of bits is from a different page; and
   a plurality of wordlines each comprising a plurality of said pages, wherein at least one sector spans said plurality of pages.

12. A multi-level cell flash memory device, comprising:
   a plurality of cells, wherein each cell of said multi-level cell flash memory device is capable of storing a plurality of bits, wherein each of said plurality of bits is from a different page; and
   a plurality of wordlines each comprising a plurality of said pages, wherein a current page is encoded using at least one code and code rate for a determined page type of said current page and wherein said encoded current page is stored in said multi-level cell flash memory device, wherein a first page type having a lower reliability than a second page type is encoded using one or more of a more powerful code and a lower code rate than said second page type.

13. The multi-level cell flash memory device of claim 12, wherein a number-of-sectors per page associated with said determined page type is determined and wherein said determined number-of-sectors are accumulated prior to said encoding of said current page.

14. The multi-level cell flash memory device of claim 12, wherein each page in a wordline is encoded to a substantially similar length using a corresponding code rate.

15. The multi-level cell flash memory device of claim 12, wherein said multi-level cell flash memory device is further configured to receive a request to read at least one sector; identify a page in said multi-level cell flash memory device having said requested sector; read said identified page and decode said read page using said at least one code and code rate associated with said identified page and obtain said requested sector from said decoded page using a memory map.

16. The multi-level cell flash memory device of claim 12, wherein one or more pages are decoded using a multi-stage decoder comprising a plurality of decoding stages to decode a plurality of pages in a wordline.

17. The multi-level cell flash memory device of claim 16, wherein a decoding stage for a first page provides a decision to a decoding stage for another page.

18. The multi-level cell flash memory device of claim 17, wherein said decision is one or more of a hard decision and a soft decision.

19. The multi-level cell flash memory device of claim 12, wherein a first page is decoded, and wherein said multi-level cell flash memory device further comprises the step of decoding at least one additional page if a decoding error for said first page is detected.

20. The multi-level cell flash memory device of claim 12, wherein each of said plurality of pages has an associated code rate such that an uncoded length of each of said plurality of pages are substantially similar and a coded length of each of said plurality of pages are different.

21. The multi-level cell flash memory device of claim 12, wherein each of said plurality of pages has an associated code rate such that an uncoded length of each of said plurality of pages are different and a coded length of each of said plurality of pages are substantially similar.

22. The multi-level cell flash memory device of claim 12, wherein each cell of said multi-level cell flash memory device is capable of storing a plurality of bits, wherein each of said plurality of bits is from a different page and wherein said plurality of wordlines each comprises a plurality of said pages, wherein at least one sector spans said plurality of pages.

* * * * *